United States Patent [19]
Gardner et al.

[11] Patent Number: 6,096,659
[45] Date of Patent: Aug. 1, 2000

[54] MANUFACTURING PROCESS FOR REDUCING FEATURE DIMENSIONS IN A SEMICONDUCTOR

[75] Inventors: Mark I. Gardner, Cedar Creek; Mark C. Gilmer, Austin, both of Tex.

[73] Assignee: Advanced Micro Devices, Inc., Sunnyvale, Calif.

[21] Appl. No.: 09/059,159

[22] Filed: Apr. 13, 1998

[51] Int. Cl.$^7$ .................................................. H01L 21/00
[52] U.S. Cl. .................... 438/736; 438/947; 438/950; 438/739; 438/742; 438/744
[58] Field of Search .................................. 438/739, 742, 438/950, 947, 736, 744

[56] References Cited

U.S. PATENT DOCUMENTS 4,639,288   1/1987   Price et al. ............................... 156/643

*Primary Examiner*—Janet Baxter
*Assistant Examiner*—Amanda C. Walke

[57] ABSTRACT

A process for reducing dimensions of circuit elements in a semiconductor device. The process reduces feature sizes by using an intermediate etchable mask layer between a photo-resistive mask and a layer to be etched. The etchable mask layer below the photo-resistive mask is etched and portions remain which undercut the pattern on the photo-resistive mask. After removing the photo-resistive mask, the remaining mask portions are then used to mask the layer to be etched. By undercutting the photo-resistive mask, the mask portions form a pattern having features with widths that are less than widths of features in the photo-resistive mask. The layer to be etched can then be etched to provide circuit elements with reduced dimensions.

20 Claims, 2 Drawing Sheets

MANUFACTURING PROCESS FOR REDUCING FEATURE DIMENSIONS IN A SEMICONDUCTOR

FIELD OF THE INVENTION

The present invention is directed generally to semiconductor devices and, more particularly, to a process for manufacturing semiconductors to reduce feature dimensions.

BACKGROUND OF THE INVENTION

Over the last few decades, the electronics industry has undergone a revolution by the use of semiconductor technology to fabricate small, highly integrated electronic devices. The most common semiconductor technology presently used is silicon-based. A large variety of semiconductor devices have been manufactured having various applicability and numerous disciplines. One such silicon-based semiconductor device is a metal-oxide-semiconductor (MOS) transistor.

The principal elements of a typical MOS semiconductor device are illustrated in FIG. 1. The device generally includes a gate electrode 103, which acts as a conductor, to which an input signal is typically applied via a gate terminal (not shown). Heavily doped source/drain regions 105 are formed in a semiconductor substrate 101 and are respectively connected to source and drain terminals (not shown). A channel region 107 is formed in the semiconductor substrate 101 beneath the gate electrode 103 and separates the source/drain regions 105. The channel is typically lightly doped with a dopant type opposite to that of the source/drain regions 105. The gate electrode 103 is physically separated from the semiconductor substrate 101 by a gate insulating layer 109, typically an oxide layer such as $SiO_2$. The insulating layer 109 is provided to prevent current from flowing between the gate electrode 103 and the source/drain regions 105 or channel region 109.

In operation, an output voltage is typically developed between the source and drain terminals. When an input voltage is applied to the gate electrode 103, a transverse electric field is set up in the channel region 107. By varying the transverse electric field, it is possible to modulate the conductance of the channel region 107 between the source region/drain regions 105. In this manner an electric field controls the current flow through the channel region 107. This type of device is commonly referred to as a MOS field-effect-transistors (MOSFET).

Semiconductor devices, like the one described above, are used in large numbers to construct most modern electronic devices. In order to increase the capability of such electronic devices, it is necessary to integrate ever increasing numbers of such devices into a single silicon wafer. As the semiconductor devices are scaled down (i.e., made smaller) and in order to form a larger number of devices on a given surface area, the structure of the devices and fabrication techniques used to make such devices must be altered.

One important step in the manufacture of MOS devices is the formation of the gate electrodes. Smaller gates are desirable to increase circuit speed. For example, the drive current in a MOS transistor is inversely proportional to the channel length or width of the gate electrode at a given set of terminal voltages. Accordingly, it is normally desired to increase the drive current of the transistor by making the gate width as small as possible, taking into consideration the reliability considerations of the process and technology being used. However, gate size is limited in part by the smallest dimension feature achievable with a mask pattern using a particular mask material.

The above described conventional techniques for forming gates impose limitations on the ability to further reduce gate sizes. Thus, the ability to further scale down the semiconductor devices is hindered.

SUMMARY OF THE INVENTION

Generally, the present invention relates to a process for making a semiconductor device. The process reduces feature sizes by using an intermediate etchable mask layer between a photo-resistive mask material and a layer to be etched. The etchable mask layer below the patterned mask material is etched and portions remain which undercut the patterns on the mask material. The photo-resistive mask is removed, and the remaining mask portions are then used to mask the layer to be etched. By undercutting the photo-resistive mask material, the nitride portions form a pattern having features with widths that are less than widths of features in the pattern of the photo-resistive material.

In one embodiment, the invention is a method for making a semiconductor device. The method comprises the steps of: forming a silicon substrate; forming a dielectric layer on the substrate; depositing a gate electrode layer on the dielectric layer; forming a first mask layer of etchable material on the gate electrode layer; forming a pattern of features with a photo-resistive material on the first mask layer; and etching the first mask layer to form mask portions having width dimensions that are less than width dimensions of the features of the photo-resistive pattern.

The above summary of the present invention is not intended to describe each illustrated embodiment or every implementation of the present invention. The figures and the detailed description which follow more particularly exemplify these embodiments.

BRIEF DESCRIPTION OF THE DRAWINGS

The invention may be more completely understood in consideration of the following detailed description of various embodiments of the invention in connection with the accompanying drawings, in which.

Figure 1:
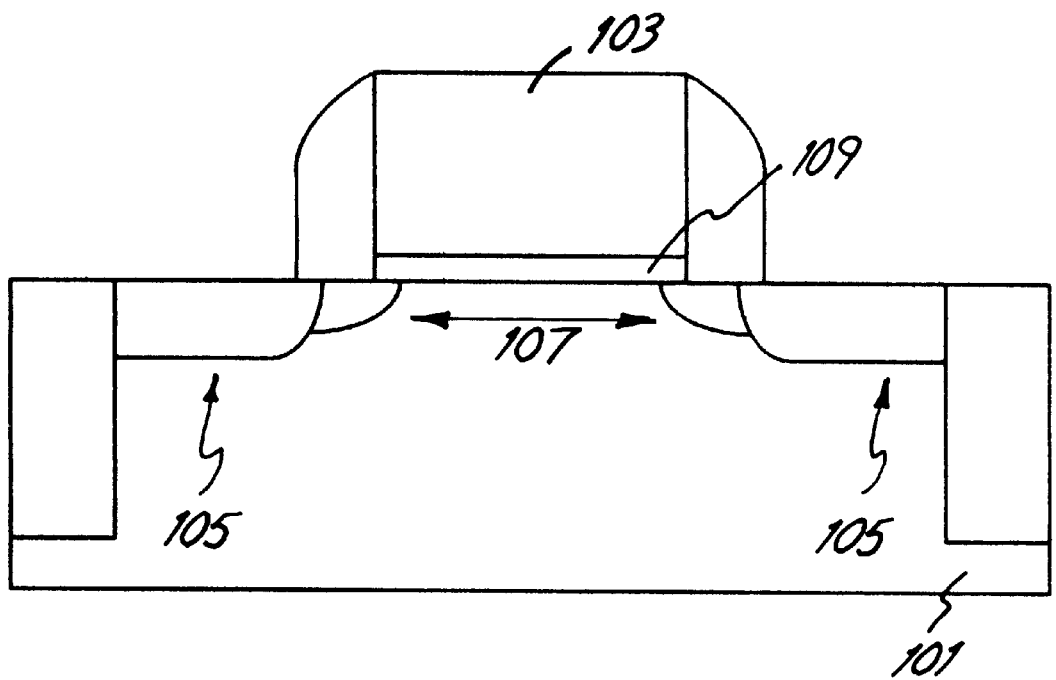
FIG. 1 illustrates a conventional MOS device.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

The present invention is believed to be applicable to a number of semiconductor devices which have a gate electrode disposed on a gate insulating layer. The invention has been found to be particularly advantageous in applications where it is desirable to form a gate insulating layer used in a MOS device, such as a PMOS, NMOS, CMOS, or BiCMOS device. While the present invention is not so limited, an appreciation of various aspects of the invention is best gained through a discussion of various application examples of processes used to form such semiconductor devices.

The present invention provides a method to reduce the channel length of a transistor, or other silicon based circuit element. In the case of a transistor, the reduced size increases the drive current and thereby enhances circuit speed. In today's production environments, most steppers are working at 0.30 μm resolution, wherein the minimum resolution is 0.2 μm. Certain XRAY techniques can achieve smaller dimensions. However, the throughput of such techniques is not suitable for widespread use of the techniques. The present process provides high volume production and dimensions that approach those achievable with XRAY type processes.

Generally, the example processes discussed below illustrate a variety of techniques for reducing the line width of a circuit element formed with a semiconductor. FIGS. 2A through 2D illustrate a fabrication process in accordance with an embodiment of the invention in which added oxide and nitride layers are deposited on a poly-silicon layer for the purpose of forming reduced length channels below the poly-silicon.

Figure 2A:
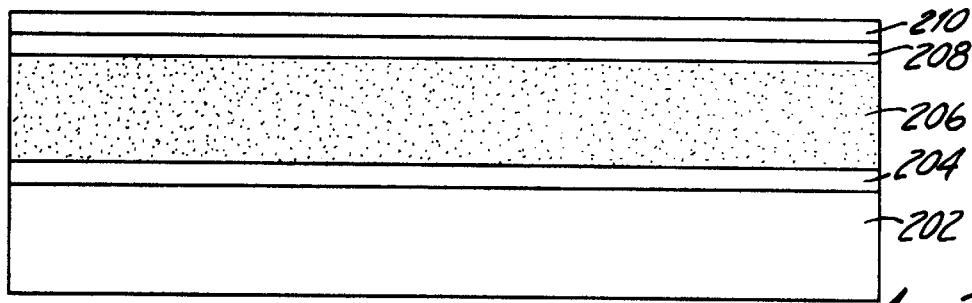
FIGS. 2A–2D illustrate an example fabrication process for making a semiconductor device in accordance with various embodiments of the invention.

FIG. 2A is a cross-sectional view of a semi-conductor structure formed in accordance with an example embodiment of the present invention. Conventional processes are used to construct substrate 202 having an oxidation layer 204. It will be appreciated that oxide layer 204 could be, in an alternate embodiment an oxynitride layer. In the example embodiment, oxidation layer 204 is from about 15 to 25 Å thick.

The gate electrode layer 206 is formed, for example, by depositing poly-silicon, amorphous silicon, or a metal (e.g., tungsten or copper) using known techniques. The thickness of the gate electrode layer is selected in consideration of the desired thickness of the gate electrode stack. Example poly-silicon or amorphous silicon thicknesses can range from about 200 to 3000 Å, while metal thickness are generally somewhat less.

In a departure from the prior art, a second oxide layer 208 is formed on the gate electrode layer 206, and a nitride layer 210 is deposited on the second oxide layer. The second oxide layer 208 can be formed with conventional techniques and in an example embodiment is approximately 100 Å thick. The nitride layer 210 is about 150 Å thick and is formed, for example, using a sputter deposition process. Sputtering nitride typically involves making a plasma solution of nitrogen gas to provide ionized nitrogen atoms, accelerating the atoms toward a silicon target, thereby depositing the silicon nitride byproduct on the surface of the substrate. The sputtered deposition process advantageously provides a very slow deposition rate and allows for enhanced control over the thickness of the deposition silicon nitride layer 202. Moreover, the sputter nitride deposition process is typically a room temperature process. For example, the chamber used in the sputtering process operates at room temperature and at about 10 E-8 torr core pressure. In another embodiment, a nitride layer is formed in-situ with the gate electrode layer 206 and oxide layer 208. The in-situ deposition of the nitride layer 210 with the previously formed gate electrode layer 206 and oxide layer 208 typically involves purging the sputter deposition chamber and changing the plasma solution to a nitrogen plasma solution and changing the sputter deposition target to a silicon target.

Figure 2B:
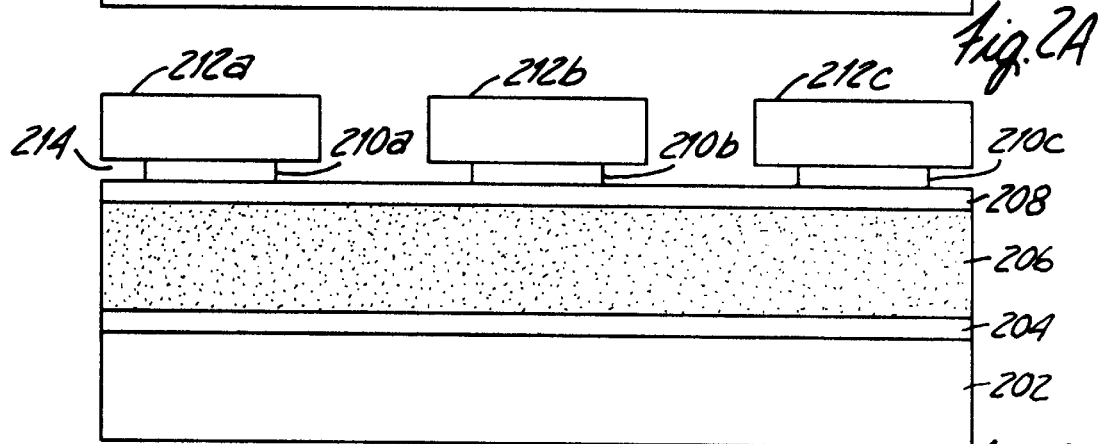

FIG. 2B is a cross-sectional view of a semiconductor structure formed in accordance with other example embodiments of the method of the present invention. A pattern of photo-resistive material is formed on the nitride layer 208. Portions 212a, 212b, and 212c illustrate the photo-resistive material that remains after the desired pattern is formed. Then, the nitride layer 210 is etched as masked by the photo-resist pattern formed by portions 212a–c. The etching of the nitride layer 210 is accomplished, for example, using a 100:1 HF solution. Alternatively, a plasma etch may be used to etch the nitride layer 210. Nitride portions 210a, 210b, and 210c remain after etching. It will be appreciated that etching of the nitride layer 210 stops at the second oxide layer 208 with, for example, a plasma etch. In addition, the photo-resistive portions 212a–c are undercut as shown by example gap 214 beneath photo-resistive portion 212a. The result of undercutting the photo-resistive portions 212a–c are reduced width nitride portions 210a–c. The process can be controlled, for example, with the concentration of the wet etch as well as etch time.

In an alternate embodiment, either of oxide layer 208 or nitride layer 210 could be individually used between mask material portions 212a–c and poly-silicon layer 206. For example, instead of forming both oxide layer 208 and nitride layer 210 on poly-silicon layer 206, only oxide layer 208 is formed. If an HF wet etch or buffered oxide etch were used, the resulting oxide portions (not shown) would be similar to nitride portions 210a–c.

The overall result is a reduction in channel length. In the prior art, the photo-resistive pattern shown in FIG. 2B is as small as the feature size could be made. Therefore, in the prior art when the photo-resistive pattern of FIG. 2B is directly deposited (no intermediate oxide and nitride layers) on the poly-silicon layer, the smallest feature dimension is that shown by the photo-resistive pattern in FIG. 2B. In other words, the poly-silicon gate width is the same as the photo-resistive portions 212a–c. As compared to the prior art, the undercutting of the photo-resistive portions 212a–c into the intermediate nitride layer leaves nitride masking portions 210a–c having widths that are less than the photo-resistive portions of FIG. 2B. It is estimated that a feature formed by the nitride pattern is approximately 0.10 μm, whereas a feature formed by the photo-resistive pattern may be 0.20 μm.

Figure 2C:
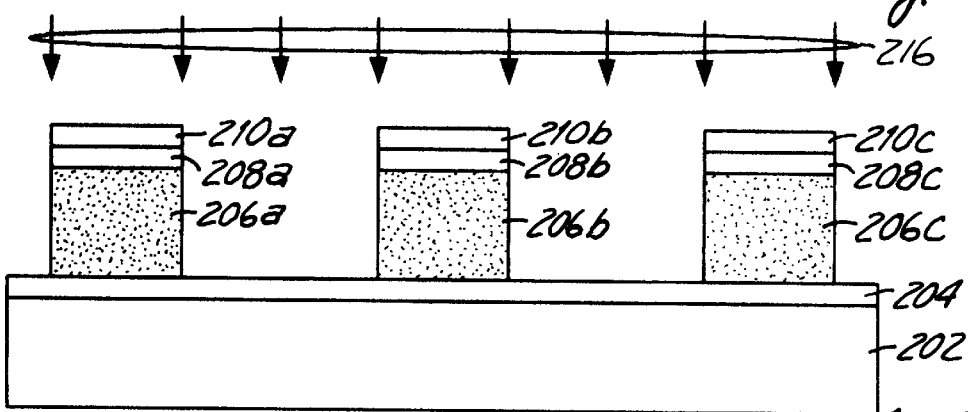

FIG. 2C is a cross-sectional view of a semi-conductor structure after stripping the photo-resistive material 212a–c and etching the poly-silicon layer 206. The photo-resistive material 212a–c of FIG. 2B is first stripped from the structure. Then, the oxide layer 208 and poly-silicon layer 206 are etched as masked by nitride portions 210a–c. Removal of portions of the oxide layer 208 and gate electrode layer 206 may, for example, be performed using known etching techniques such as plasma etching. Gate electrodes 206a, 206b, and 206c remain after etching.

Next, LDD (lightly-doped drain) regions (not shown) are formed as indicated by arrows 216. For example, a relatively shallow implant of a doping agent, such as boron or arsenic, is performed to form lightly-doped regions in the substrate 202. The shallow implant may be performed using known dosages, implant energies and implant techniques. Following the shallow dopant implant, the remaining nitride portions 210a–c and oxide portions 208a–c are etched, for example, using a plasma or wet etch.

Figure 2D:
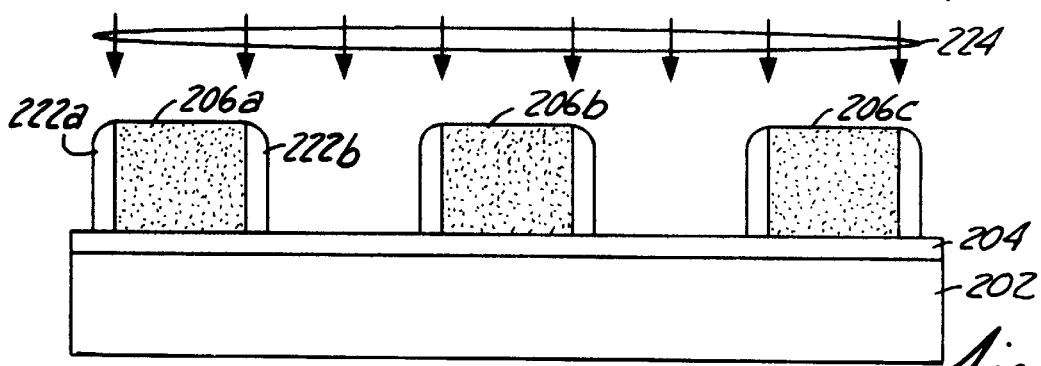

FIG. 2D is a cross-sectional view of a semiconductor structure with the addition of spacers on the gate electrodes. Spacers, for example 222a and 222b, are formed on the side-walls of the poly-silicon portions 206a–c. Using the spacers for alignment, a relatively high dose implant of a doping agent is performed, as illustrated by arrows 224, to form heavily-doped regions (not shown) in the substrate 202. For example, an N+ implant may be performed to for the source and drains for an n-channel MOSFET.

As noted above, the present invention is applicable to fabrication of a number of different devices. Accordingly, the present invention should not be considered limited to the particular examples described above, but rather should be understood to cover all aspects of the invention as fairly set out in the attached claims. Various modifications, equivalent processes, as well as numerous structures to which the present invention may be applicable will be readily apparent to those of skill in the art upon review of the present specification. The claims are intended to cover such modifications and devices.

We claim:

1. A method for manufacturing a semiconductor structure, comprising the steps of:

forming a silicon substrate;

forming a dielectric layer on the substrate;

depositing a gate electrode layer on the dielectric layer;

forming a first mask layer of etchable material on the gate electrode layer;

forming a pattern of features with a photo-resistive material on the first mask layer;

etching the first mask layer to form mask portions having width dimensions that are less than width dimensions of the features of the photo-resistive pattern; and forming a transistor including the gate electrode.

2. The method of claim 1, wherein the step of forming the first mask layer includes the step of forming an oxidation layer on the gate electrode layer.

3. The method of claim 2, wherein the step of etching includes etching the oxidation layer with HF.

4. The method of claim 2, wherein the oxidation layer formed on the gate electrode layer is approximately 100 Å thick.

5. The method of claim 1, wherein the step of forming the first mask layer includes the step of forming a nitride layer on the gate electrode layer.

6. The method of claim 5, wherein the step of etching includes etching the nitride layer with HF.

7. The method of claim 1, wherein the step of forming the first mask layer includes the steps of:

forming an oxidation layer on the gate electrode layer; and depositing a nitride layer on the oxidation layer.

8. The method of claim 7, wherein the step of etching the nitride layer is performed with a plasma etch.

9. The method of claim 1, further comprising the steps of:

removing the photo-resistive material; and etching the gate electrode layer as masked by the mask portions to form gate electrodes.

10. The method of claim 9, wherein forming a transistor includes the steps of:

forming lightly-doped drain regions in the substrate adjacent the gate electrodes;

forming spacers on side-walls of the gate electrodes; and forming heavily-doped regions adjacent the lightly-doped regions.

11. The method of claim 9, further comprising the step of removing the mask portions from the gate electrode.

12. The method of claim 1, wherein the dielectric layer is poly-silicon.

13. The method of claim 1, wherein a dimension of a feature is approximately 0.10 $\mu$m.

14. The method of claim 13, wherein a dimension of a feature formed is approximately 0.20 $\mu$m.

15. The method of claim 1, wherein the step of forming the the first mask layer includes the steps of forming an oxidation layer on the gate electrode and forming a nitride layer on the oxidation layer, and wherein the nitride layer deposited on the oxidation layer is approximately 150 Å thick.

16. The method of claim 1, wherein the dielectric layer formed on the substrate is approximately from 15 to 25 Å thick.

17. The method of claim 1, wherein the step of forming the the first mask layer includes the steps of forming an oxidation layer on the gate electrode and forming a nitride layer on the oxidation layer, wherein the oxidation layer formed on the gate electrode layer is approximately 100 Å thick, the nitride layer deposited on the oxidation layer is approximately 150 Å thick, and the dielectric layer formed on the substrate has a thickness in a range of approximately 15 to 25 Å.

18. The method of claim 1, wherein the step of forming the first mask layer includes the steps of forming an oxidation layer on the gate electrode and forming a nitride layer on the oxidation layer.

19. The method of claim 18, wherein the step of forming the first mask layer includes the steps of forming an oxidation layer on the gate electrode and forming a nitride layer on the oxidation layer.

20. The method of claim 1, wherein the step of forming the first mask layer includes the steps of forming an oxidation layer on the gate electrode and forming a nitride layer on the oxidation layer.

\* \* \* \* \*